United States Patent [19]
Smith et al.

[11] Patent Number: 5,811,809
[45] Date of Patent: Sep. 22, 1998

[54] NUCLEAR EVENT DETECTOR AND THRESHOLD DETECTOR CIRCUIT THEREFOR

[75] Inventors: Geoffrey Smith, Bristol, Great Britain; Jiapal S. Brar, Chandigarh, India

[73] Assignee: British Aerospace Public Limited Company, Hampshire, Great Britain

[21] Appl. No.: 682,907

[22] Filed: Jul. 16, 1996

[30] Foreign Application Priority Data

Jul. 17, 1995 [GB] United Kingdom .................... 9514618

[51] Int. Cl.⁶ ...................................................... G01T 1/17
[52] U.S. Cl. .................................. 250/336.1; 250/370.15; 327/81; 327/83; 976/DIG. 426
[58] Field of Search ............................ 250/336.1, 370.15; 327/78, 80, 81, 83, 513; 976/DIG. 426

[56] References Cited

U.S. PATENT DOCUMENTS

| | | | |
|---|---|---|---|
| 4,687,622 | 8/1987 | Longden | 376/254 |
| 5,010,321 | 4/1991 | Larner et al. | 250/336.1 |
| 5,150,286 | 9/1992 | Venditto, Jr. et al. | |

*Primary Examiner*—Carolyn E. Fields
*Attorney, Agent, or Firm*—Nixon & Vanderhye P.C.

[57] ABSTRACT

A threshold detector circuit (2) suitable for use with a nuclear event detector for sensing an ionising radiation pulse has a high tolerance to ambient temperature fluctuations. The threshold detector (2) comprises an amplifier stage (3) which includes a pair of complementary transistors (Q2, Q3) and a comparator stage (6) which includes a third transistor (Q4) and a voltage reference (7). Temperature compensation is achieved by the addition of a feedback loop (5) in the amplifier stage (3) including a fourth transistor (Q1) whose temperature coefficient is closely matched to that of the third transistor (Q4).

6 Claims, 4 Drawing Sheets

5,811,809

NUCLEAR EVENT DETECTOR AND THRESHOLD DETECTOR CIRCUIT THEREFOR

This invention relates to radiation detection circuit particularly nuclear event detection circuits and to threshold detector circuit suitable for use therewith.

It is known that exploding nuclear weapons produce pulses of ionising radiation eg X rays and gamma rays. This radiation can cause damage to unprotected electronic components. To minimise the harmful effects of such radiation, it is usual to employ a nuclear event detector coupled to an appropriate form of protection circuit.

Known nuclear event detectors (see for example U.S. Pat. No. 4,687,622) sense a pulse of ionising radiation and themselves generate a pulse of pre-set duration which activates, for example, a power supply crowbar circuit. Circuits of this type can remove the power from the vulnerable electronic components within a very short timescale.

The nuclear event detector of U.S. Pat. No. 4,687,622 includes an ionising radiation sensor which provides an output signal when an incident pulse exceeds a threshold level. It further includes a pulse timer circuit, responsive to the output signal for providing a timing signal pulse of predetermined duration. Also included is a latch circuit, triggered by the output of the timer circuit which provides a flag signal indicating that an ionising pulse has been sensed. The timing signal pulse can be used to quickly trigger associated protection circuitry. The nuclear event detector disclosed in U.S. Pat. No. 4,687,622 has the disadvantage of a low tolerance to temperature variation.

An object of this invention is to provide temperature compensated circuitry suitable for incorporation in a nuclear event detector.

According to one aspect of this invention a temperature compensated threshold detector circuit comprises:

an amplifier stage, having a pair of complementary transistors, whose output is connected to a comparator stage, comprising a third transistor and a voltage reference device;

the amplifier stage being provided with a DC feedback loop which includes a fourth transistor whose base-emitter voltage and temperature coefficient are closely matched to that of the third transistor.

According to a second aspect of this invention, a temperature compensated nuclear event detector comprises;

an ionising radiation sensor for producing an output signal in response to a nuclear event, a threshold detector circuit according to said first aspect of the invention for producing a trigger pulse in response to said output signal, and a pulse timer circuit for producing a nuclear event output pulse of pre-set duration in response to said trigger pulse.

Preferably the pulse timer circuit is a temperature compensated pulse timer circuit as described and claimed in our co-pending U.S. application Ser. No. 08/680,970.

Optionally the nuclear event detector may be provided with a latch circuit for providing a flag signal indicating that an ionising radiation pulse has been detected. It may also include a built-in-test circuit. Both these circuits are described in greater detail herebelow.

Some embodiments of the invention will now be described, by way of example only, with reference to the drawings of which:

In the exemplary embodiments, resistive values have been chosen in order to minimise the power requirements of the nuclear event detector both in standby and active mode.

The power supply (not shown) for the nuclear event detector (NED) can be any suitable conventional type and will, preferably, be "radiation hard".

Inherently radiation tolerant components are specified in the exemplary embodiments as being preferable for best performance. Additionally, those specified components are inherently free from "latch-up" phenomenon but will suffer transient upset at high dose rates and some degradation due to the-effects of Initial Nuclear Radiation. However, these undesirable effects are mitigated by the circuit design.

The circuit design described herebelow employs Radiation Enhancement Techniques exclusively, which avoids any conflict between normal circuit operation initiated by the prompt radiation pulse and the circuit upset caused by the prompt radiation impinging directly on the semiconductor junctions of the constituent components. At levels of prompt radiation between a pre-set detector threshold level and the spontaneous self trigger level, the NED output is triggered by a threshold detector and at all levels above the spontaneous self trigger level, it is self triggered.

As a consequence, during the detection phase, all switching transistors are switched from the OFF state into the ON state (or in case of linear devices, Enhanced), either by the threshold detector or by the prompt radiation producing photocurrent within the semiconductor devices.

The majority of conventional designs rely on depletion in some of the discrete devices for proper operation. Novel techniques are used in this invention by adapting conventional circuits to operate in enhancement mode only by employing new circuit configurations which operate exclusively in the enhancement mode.

Figure 1:
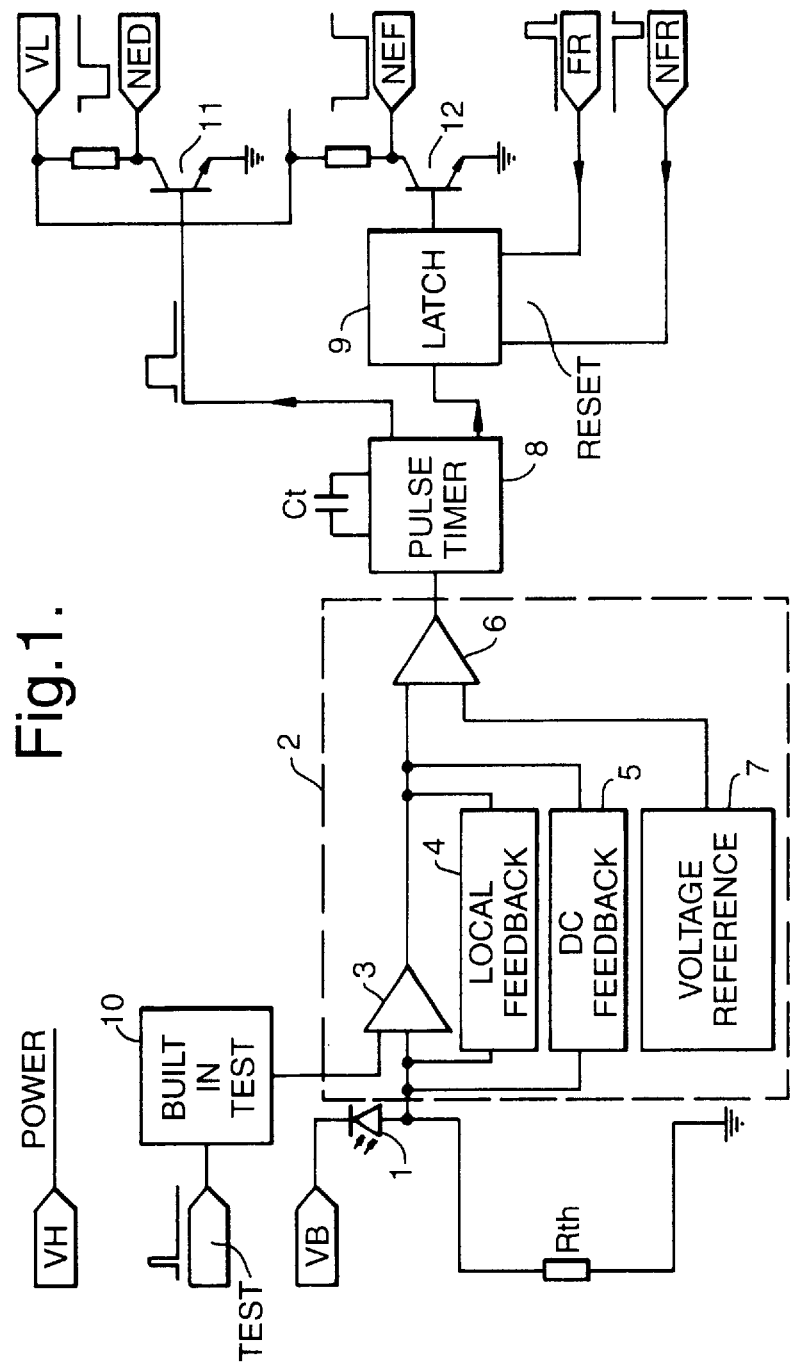
FIG. 1 is a schematic block diagram of a nuclear event detector (NED) in accordance with the invention.

Referring now to FIG. 1, an ionising radiation sensor comprising a PIN diode 1 is connected to a threshold detector circuit 2. The threshold detector circuitry comprises a pulse amplifier 3 incorporating a local feedback loop 4 and a DC feedback loop 5, and a comparator 6 controlled by a voltage reference 7. The output from the threshold detector 2 triggers a pulse timer circuit 8 which in turn triggers a latch 9. A build-in-test circuit 10 provides an alternative input to the pulse amplifier 3 for test purposes.

The prompt ionising radiation induces photocurrent in the PIN diode which is proportional to the radiation dose rate magnitude. The photocurrent pulse is converted into a voltage pulse by an external threshold set resistor (Rth) connected in series with the PIN diode 1.

The voltage pulse is amplified by the pulse amplifier 3. The amplified pulse is compared with a precision reference source by the voltage comparator 6 and if it exceeds the reference voltage a trigger pulse is generated.

The trigger pulse from the comparator 6 is used to trigger the timer 8 which comprises a monostable multivibrator, the pulse width of which is set by an external capacitor Ct. The pulse timer 8 output is connected to an open collector transistor 11 to generate the Nuclear Event (NED) pulse output.

The trigger pulse from the comparator 6 is also used to SET the bistable latch 9, which acts as a Nuclear Event memory. The latch 9 is RESET either by a LOW level sensitive input (NFR) or a HIGH level sensitive input (FR). The latch 9 output is connected to an open collector transistor 12 to generate a Nuclear Event Flag (NEF) output.

The PIN diode 1 is biased via a power input VB and the NEF and NED outputs are pulled up by internal 10k Ohm resistors to a power level VL. The internal circuitry is supplied from a power input VH.

The PIN diode 1 is biased at between 4.5V and 20V by the VB input. The value of the resistor Rth is selected to develop 1.2V at the dose rate detection threshold level. This leaves at least 3.3V across the PIN diode 1 with VB=4.5V, which is sufficient to keep the PIN diode 1 usefully depleted. In order that the threshold resistor is not modified by the subsequent stage 2, the input impedance must be greater than the maximum set resistor.

In order to minimise the radiation pulse width dependence, the input capacitance of the subsequent stage 2 must be minimised as must the external stray capacitance; the threshold set resistor should therefore be placed as near as practicable to the threshold detector stage 2.

Operation of the threshold detector circuit 2 will now be described with reference to FIG. 2.

Firstly, it is instructive to note that a single conventional operational amplifier cannot be used as the pulse amplifier in the NED circuit because it is susceptible to malfunction by the prompt ionising radiation.

Hence, the pulse amplifier (designated 3 in FIG. 1) is fabricated from a pair of high speed complementary transistors Q2 and Q3. Q2 is an NPN type and Q3 is a PNP type and the gain of this amplifier stage is unity. 100% negative (local) feedback increases the input impedance to hundreds of kilohms, reduces the output impedance to less than 500 ohms, improves frequency response and makes the circuit less sensitive to transistor parameter changes due to temperature fluctuation or neutron fluence.

The comparator stage (designated 6 in FIG. 1) of the threshold detector circuit comprises an NPN transistor Q4 and a voltage reference (designated 7 in FIG. 1) is provided by a voltage reference diode D2. This diode sets the threshold voltage at 1.2 volts and has inherently good temperature stability.

The pulse amplifier is the most critical element in the NED circuit. It must present a high input impedance to the PIN diode detector D1 hence its input transistor must have a high $h_{FE}$ and it must be operated at a low collector current. It must also have a fast rise time in order to respond to the short duration radiation pulse ie it must also have a high $f_t$. The transistor Q2 specified for the input stage of the pulse amplifier (2N5179) has the desirable attributes of high current gain and high $f_t$ at low collector currents.

A major weakness of this buffer transistor Q2 however is its considerable negative temperature coefficient which is exacerbated by the comparator stage. In order to minimise the drifts due to temperature and power supply variations, an additional dc (low frequency) feedback loop comprising an additional NPN transistor Q1, a resistor R7 and a capacitor C8 is provided.

This dc feedback loop maintains the static voltage at the emitter of transistor Q2 at the base emitter voltage $V_{BE}(ON)$ of Q1, which is closely matched in magnitude and has the same temperature coefficient as the $V_{BE}(ON)$ of transistor Q4 in the comparator; The $V_{BE}$ of the two transistors are specified to be matched to within 10 mV. Effectively, the dc negative feedback biases the base of transistor Q4 by its own $V_{BE}(ON)$ at all temperatures. Consequently the switching threshold of transistor Q4 as seen at the base of transistor Q4, is virtually independent of the transistor Q4 base-emitter voltage $V_{BE}(ON)$ and its temperature coefficient and is dependent only upon the 1.2V reference voltage of D2. Thus any transient increase in excess of 1.2V over the static level at the emitter of Q2 will turn transistor Q4 ON.

Due to the low output impedance of the pulse amplifier, current limiting is incorporated in both the amplifier and the comparator. A resistor R8 is included in the amplifier output transistor emitter supply; the value has been selected to have minimal effect on the amplifier performance. A resistor R13 is also included in the comparator stage to prevent excessive dc current flow into the voltage reference diode D2. A capacitor C3 maintains the emitter of Q4 to within 10% of the 1.2V reference voltage for a minimum of 10 ns to ensure consistent transient performance of the comparator stage. The worst case tolerance of the AD589T voltage reference diode D2 is less than ±3% for all environmental effects.

The incremental voltage gain from the base of Q2 to its emitter is a tightly defined unity, hence any increase of more than >1.2V, over the static level, at the base of Q2 will switch transistor Q4 ON. Since the voltage output from the threshold set resistor Rth is capacitively coupled to the pulse amplifier input, any voltage pulse with a peak amplitude greater than 1.2V will trigger the comparator. Capacitor C8 blocks the ac feedback at the frequencies associated with the prompt ionising radiation pulse.

The dc feedback loop, by controlling Q2 emitter voltage, also defines the static bias levels of transistors Q2 and Q3. The ac feedback in the loop is inherently stable as there is one 90° lag (R7 and C8) and one 180° phase reversal (transistor Q1) which leaves a satisfactory phase margin of 90°.

Thus the two fold action of the 100% ac negative local feedback and the dc negative feedback provides a fast response time to the comparator and greatly reduces the effects of ambient temperature, transistor parameter changes and supply voltage variations on the detection threshold of the circuit.

Figure 2:
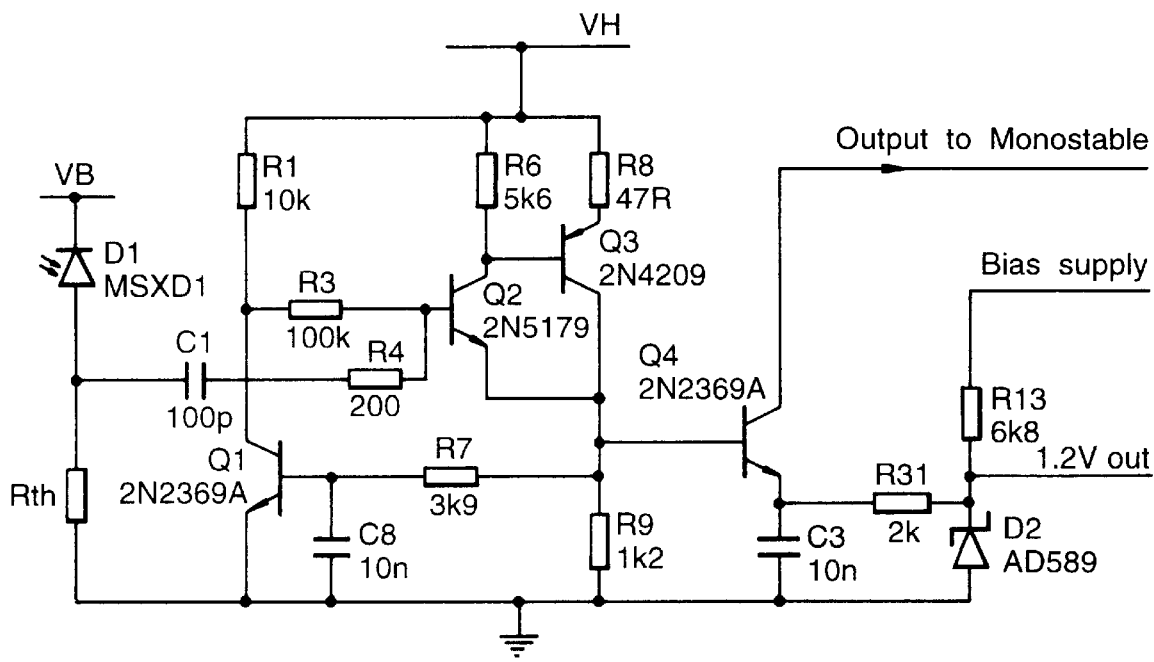
FIG. 2 is a circuit diagram of a threshold detector circuit forming a part of the NED of FIG. 1.

The comparator stage of FIG. 2 comprising the transistor Q4 and the voltage reference diode D2 is particularly suited to this application because the stage does not (in contract to other more conventional comparator circuits) employ depletion for proper operation. Hence it is not susceptible to malfunction by the prompt ionising radiation pulse. As can be seen from FIG. 2, the reference voltage is applied to the emitter of the transistor Q4 and the input signal (from the pulse amplifier) to its base.

Switching of transistor Q4 occurs when the input signal from the pulse amplifier exceeds the reference by the forward voltage $V_{BE}(on)$ of the transistor Q4. At this point, a signal appears at the collector of Q4 which is used to trigger the next stage (ie the monostable, pulse timer circuit).

The construction and operation of the pulse timer circuit 8 will now be described with reference to FIG. 3. As previously mentioned, this circuit is essentially a monostable multivibrator which comprises a pair of complementary transistors Q5 and Q6. Q5 is a PNP type and Q6 is an NPN type transistor. Choosing a complementary pair ensures that the monostable circuit has good radiation tolerance. It also consumes negligible power in the standby state.

The width of the timing pulse generated by the monostable multivibrator can be set by an appropriate choice of value of the timing capacitor Ct. However, pulse width is affected to a certain degree by variations in ambient temperature. This variation is primarily due to the (non-linear) variation of the base-emitter voltage $V_{BE}$(ON) of the transistor Q5 with temperature. The base-emitter voltage variation with temperature of Q6 is also a contributory factor, as can be variations in power supply voltage.

To minimise the effect of temperature variations on pulse width owing to the behaviour of Q5, an additional component is connected across the emitter and base of Q5, this component (ideally) having an equal temperature coefficient. The additional component could be a negative temperature coefficient resistor. However, this solution is not perfect because the temperature coefficient of the resistor is linear whereas that of transistor Q5 is non-linear.

Figure 3:
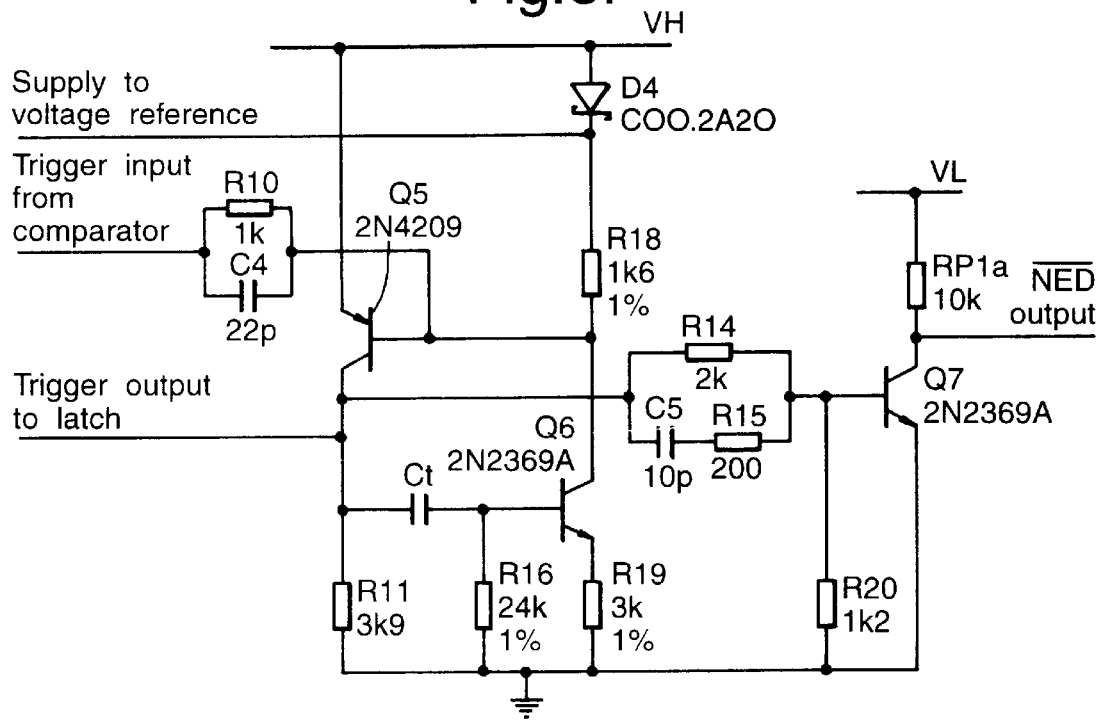
FIG. 3 is a circuit diagram of a pulse timer circuit forming a part of the NED of FIG. 1 and of the type claimed in our co-pending U.S. application Ser. No. 08/680,970.

A better solution is to use a resistor R18 in series with a Schottky diode D4 as shown in FIG. 3.

The forward voltage change ($V_F$) in Schottky diodes with respect to temperature is almost equal to that of the base-emitter junction of the bipolar transistors (approximately −2.2 mV/° C.) but the magnitude of $V_F$ is less than half (200 mV to 300 mV instead of 600 mV). This leaves at least 300 mV head room for transistor Q5 base-emitter excursions, which is sufficient to allow unrestricted operation of the circuit.

Commonly available Schottky diodes fall into two distinct categories viz. low barrier height types and high barrier height types. The former are optimised for forward characteristics at the expense of reverse leakage and are intended for low voltage switching power supplies. The latter are optimised for reverse leakage at the expense of forward voltage drop and are intended for general applications. For this application, the high barrier type is recommended.

Further improvement is possible by compensation for Q6 base-emitter voltage variation by employing a further Schottky diode (not shown) across the base and emitter of Q6.

In operation, when Q5 is switched ON by the current pulse from the prompt ionising radiation detector, it turns ON Q6 via Ct. Both transistors are maintained in the ON state by regenerative feedback until the voltage across R16 can no longer maintain Q6 collector current. Due to the relatively low value of R18, transistor Q5 is essentially voltage controlled and both of the transistors will rapidly switch OFF. The output from the monostable goes to an open collector NED output drive transistor Q7. Speed up components resistor R15 and capacitor C5 reduce the turn on delay time of transistor Q7. Q7 is powered from power rail VL via a pull-up resistor RP1a.

Note that a high level prompt ionising radiation pulse can also turn both transistor Q5 and Q6 ON independently of a trigger from the comparator stage. Thus a pulse will always be generated by the monostable circuit in response to incident radiation as the radiation behaviour of the monostable multivibrator is never in conflict with normal operation.

Figure 4:
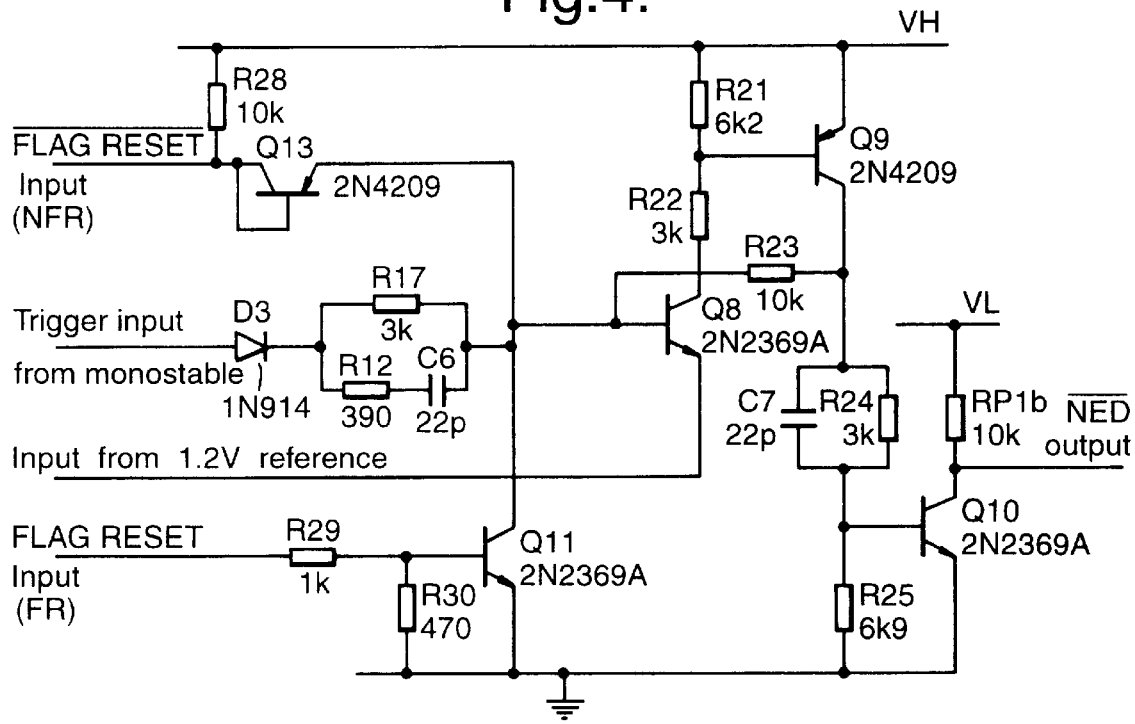
FIG. 4 is a circuit diagram of a latch circuit forming a part of the NED of FIG. 1.

Referring now to FIG. 4. the latch circuit (designated 9 in FIG. 1) is essentially a bistable multivibrator which uses a pair of complementary transistors Q8 and Q9.

In this circuit, the transistors are configured so that both transistors are in the OFF state until a trigger pulse is applied, when both transistors are switched ON. This circuit will therefore not be corrupted by a prompt ionising radiation pulse; the radiation only serves to reinforce the normal triggering action.

The bistable therefore consists of an NPN common emitter voltage amplifier (Q8), driving a PNP common emitter voltage amplifier (Q9). Regenerative feedback is applied via resistor R23 which maintains the bistable in either of its two stable states. The emitter of Q8 is maintained at 1.2V derived from the reference diode D2 of the threshold detector circuit. Biasing Q8 in this manner increases the noise immunity of the trigger level of the bistable from <0.6V to approximately 1.2V.

Assuming that the bistable is in the RESET state, and in the absence of a NED pulse from the pulse timer circuit, transistor Q8 is maintained in the OFF state by resistors R23, R24 and R25. When the NED pulse is applied to the base of transistor Q8 via D3 and R17, transistor Q8 conducts and this turns on transistor Q9 via resistor R22. The collector of Q9 goes HIGH and maintains Q8 in the ON state even after the pulse generator output goes LOW. Diode D3 is included to provide isolation during this state. The bistable is RESET by switching OFF Q8 either by the NFR input via the diode configured transistor Q13 or by the FR input via transistor Q11. The output from the flag goes to an open collector NEF output drive transistor Q10. Speed up components R12 and C6 reduce the time required to SET the flag and C7 reduces the turn on delay time of transistor Q10.

The FR switching level is independent of the supply voltage but is dependent on the $V_{BE}$ of Q11 which is a strong function of operating temperature and has been configured to be nominally 2.0V at ambient temperature. The low value of input resistors ensure a rapid response and minimal variation with transistor gain.

The NFR switching level is virtually independent of ambient temperature and power supply voltage being set by the 1.2V reference. The forward voltage drop of transistor Q8 is largely offset by the voltage drop across Q13.

The active LOW nuclear event flag output is provided by the open collector transistor Q10 which is powered from the rail VL via a pull-up resistor RP1b. This transistor Q10 is switched by the output from the bistable comprising transistors Q8 and Q9.

Figure 5:
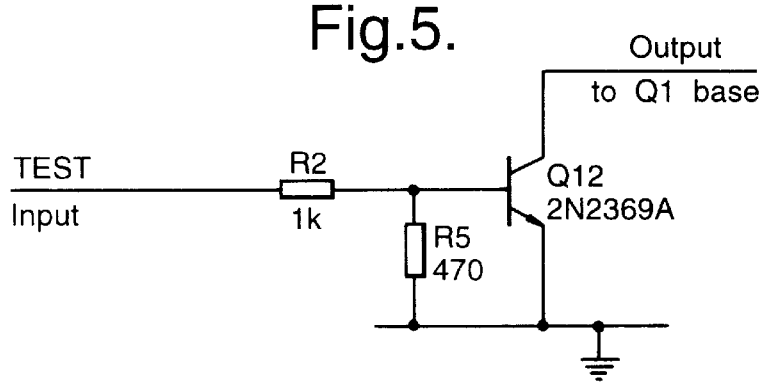
FIG. 5 is a circuit diagram of a built-in-test circuit.

The Built-in-Test circuit of FIG. 5 provides a means for testing the operation of most of the NED circuitry and comprises an NPN transistor Q12 whose collector is connected to the basis of transistor Q1 (of FIG. 2). By applying an input signal to the base of transistor Q12, this transistor is turned ON, which in turn switches Q1 OFF. The Q1 collector goes high, turning on Q4 which triggers the monostable multivibrator (FIG. 3) resulting in a NED output. The nuclear event flag is also set. The low values of the input resistors R2 and R5 in the Built-in-Test circuit ensure a rapid response and minimal variation with transistor gain.

Figure 6:
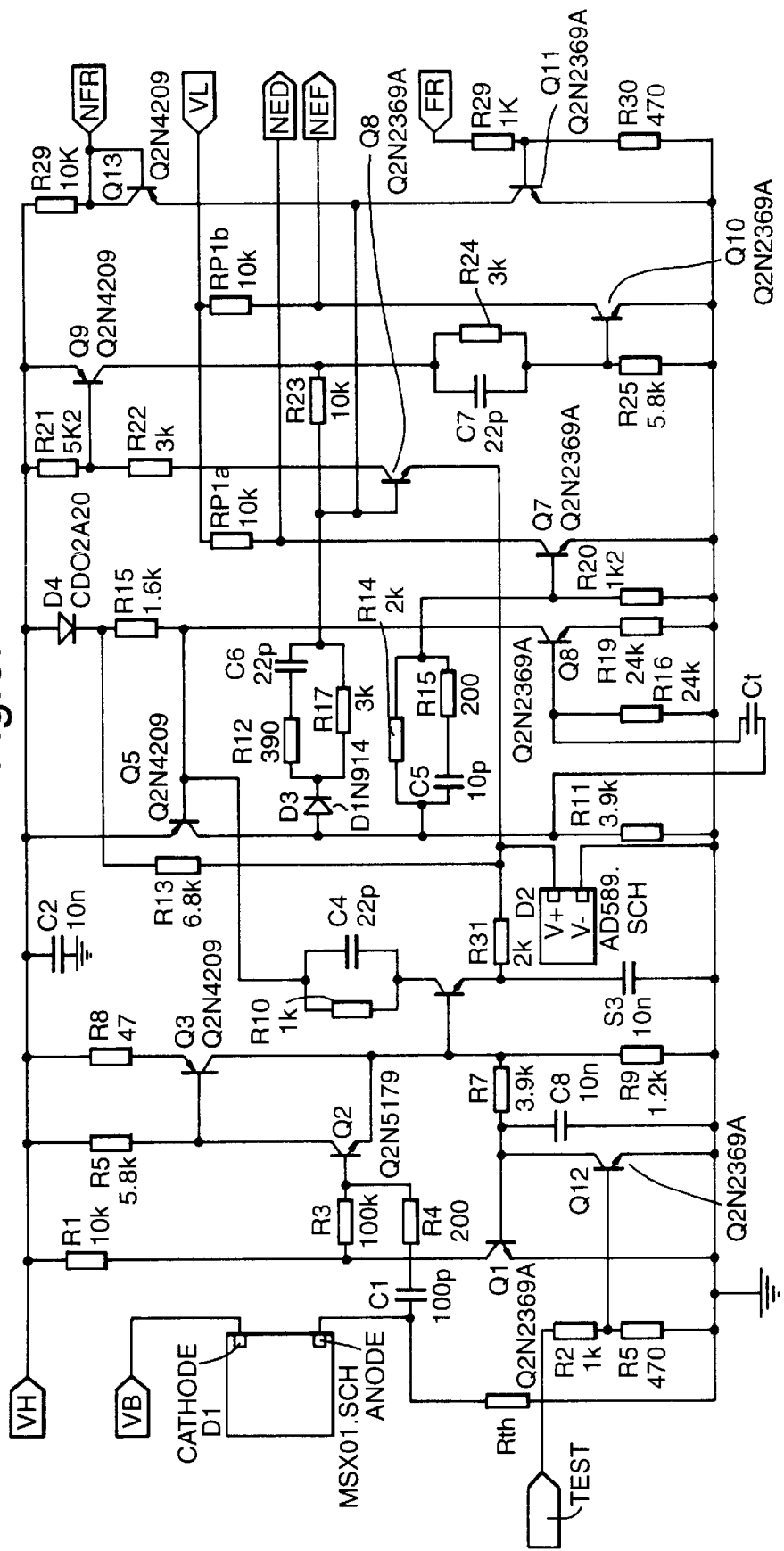
FIG. 6 is a circuit diagram of a nuclear event detector in accordance with the invention.

FIG. 6 which shows the complete nuclear event detector circuit, is self-explanatory. The choice of components shown in FIG. 6 ensures operation over the military temperature range of −55° c. to +125° c. at an operating voltage of between 4.5 volts and 5.5 volts. The circuit can be modified by the alteration of a few resistor values in order to operate from a 3 volt supply (minimum) whilst still maintaining correct operation over the military temperature range. This would enable employment of low voltage logic devices (operating at 3.3 volts).

We claim:

1. A temperature-compensated threshold detector circuit comprising:

an amplifier stage, having a pair of complementary trasistors, whose output is connected to a comparator stage, comprising a third transistor and a voltage reference device;

the amplifier stage being provided with a DC feedback loop which includes a fourth transistor whose base-emitter voltage and temperature coefficient are closely matched to that of the third transistor, wherein said threshold circuit generates an output when the amplifier stage output exceeds a reference voltage.

2. A temperature compensated nuclear event detector comprising:

an ionising radiation sensor for producing an output signal in response to a nuclear event;

a threshold detector circuit according to claim 1 for producing a trigger pulse in response to said output signal; and a pulse timer circuit for producing a nuclear event output pulse of pre-set duration in response to said trigger pulse.

3. A temperature-compensated nuclear event detector according to claim 2 in which the pulse timer circuit comprises a monostable multivibrator including a pair of complementary transistors and a device, connected across the base and emitter of one of said pair of transistors in said pulse timer circuit, whose temperature coefficient is closely matched to that of said one of the transistor pair in said pulse timer circuit.

4. A temperature-compensated nuclear event detector according to claim 2 in which the ionising radiation sensor comprises a PIN diode.

5. A temperature compensated nuclear event detector according to claim 2 further including a bistable multivibrator circuit driven by the pulse timer circuit for providing a flag signal indicating that an ionising radiation pulse has been detected.

6. A temperature compensated nuclear event detector according to claim 2 further including a built-in-test circuit for applying a test signal to the threshold detector circuit.

* * * * *